United States Patent
Kobayashi

(10) Patent No.: US 7,653,500 B2
(45) Date of Patent: *Jan. 26, 2010

(54) SEQUENTIAL TIMEBASE

(75) Inventor: Kensuke Kobayashi, Airmont, NY (US)

(73) Assignee: LeCroy Corporation, Chestnut Ridge, NY (US)

(*) Notice: Subject to any disclaimer, the term of this patent is extended or adjusted under 35 U.S.C. 154(b) by 236 days.

This patent is subject to a terminal disclaimer.

(21) Appl. No.: 11/897,860

(22) Filed: Aug. 31, 2007

(65) Prior Publication Data

US 2008/0054967 A1 Mar. 6, 2008

Related U.S. Application Data

(63) Continuation of application No. 11/346,654, filed on Feb. 3, 2006, now Pat. No. 7,280,930.

(60) Provisional application No. 60/650,985, filed on Feb. 7, 2005, provisional application No. 60/656,617, filed on Feb. 25, 2005.

(51) Int. Cl.
*G01R 13/00* (2006.01)
*G01D 18/00* (2006.01)

(52) U.S. Cl. .................. 702/69; 327/158; 375/371; 702/89

(58) Field of Classification Search ............ 702/69–71, 702/79, 89; 341/155; 327/158, 160, 237, 327/286, 294; 375/371; 348/500, 519
See application file for complete search history.

(56) References Cited

U.S. PATENT DOCUMENTS

| 4,260,912 | A | | 4/1981 | Bjorke |
| 5,099,312 | A | * | 3/1992 | Nishimura ............. 348/519 |
| 5,349,612 | A | | 9/1994 | Guo et al. |
| 5,402,019 | A | | 3/1995 | Drummond et al. |
| 5,959,479 | A | | 9/1999 | Woodward |
| 6,297,849 | B1 | * | 10/2001 | Stessen et al. .......... 348/500 |
| 6,384,657 | B1 | | 5/2002 | Dobos |
| 6,411,244 | B1 | | 6/2002 | Dobos et al. |
| 6,522,983 | B1 | | 2/2003 | Dobos et al. |
| 6,917,229 | B2 | | 7/2005 | Cho |
| 7,068,087 | B2 | | 6/2006 | Stoops et al. |

* cited by examiner

*Primary Examiner*—John H Le
(74) *Attorney, Agent, or Firm*—Gordon Kessler

(57) ABSTRACT

A method and apparatus for correcting for deterministic jitter in a sequential sampling timebase. The value of a fine analog delay is held at a substantially constant nominal rate during a duration of a counting of a digital clock. A time difference between a trigger at which a fine analog delay starts measuring time and the occurrence of a digital pulse of a stable clock used to count a coarse delay is measured. An input waveform is sampled at a sample time having a nominal delay time. After sampling, a desired compensation time is provided for the sample of the input waveform in accordance with combinations of three independent variables defining a calibration table. The waveform is reconstructed by shifting a delay time of a sampled value of the input waveform from its nominal delay time in accordance with a value defined by the calibration table.

14 Claims, 15 Drawing Sheets

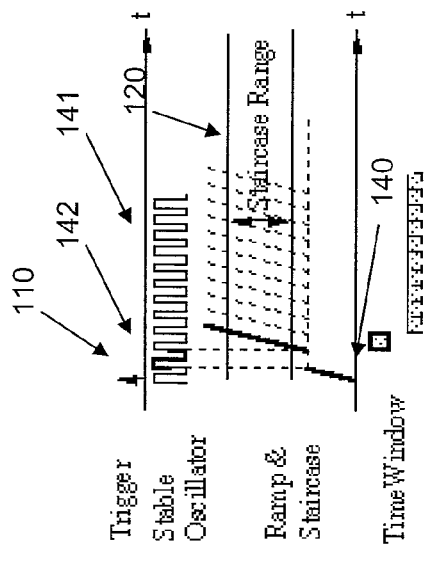
Fig. 1c - Dual stage Ramp
Prior Art
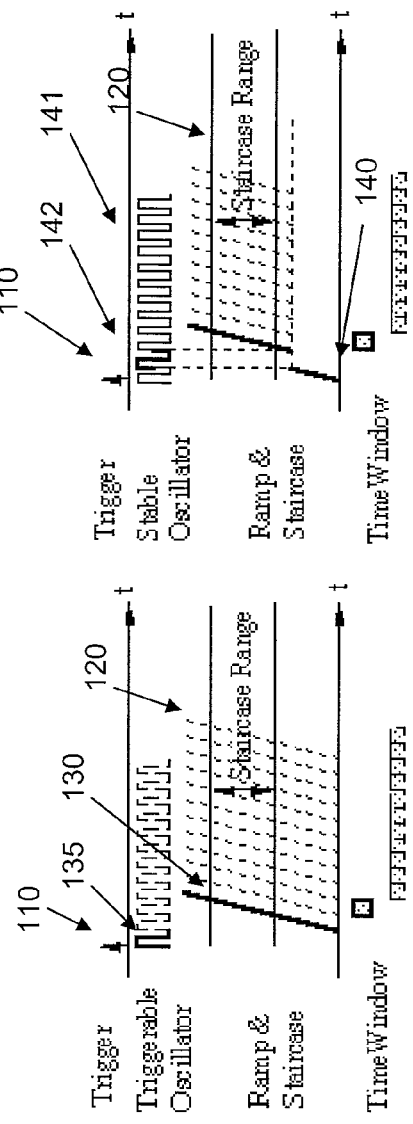
Fig. 1b - Ramp & Triggerable Osc.
Prior Art
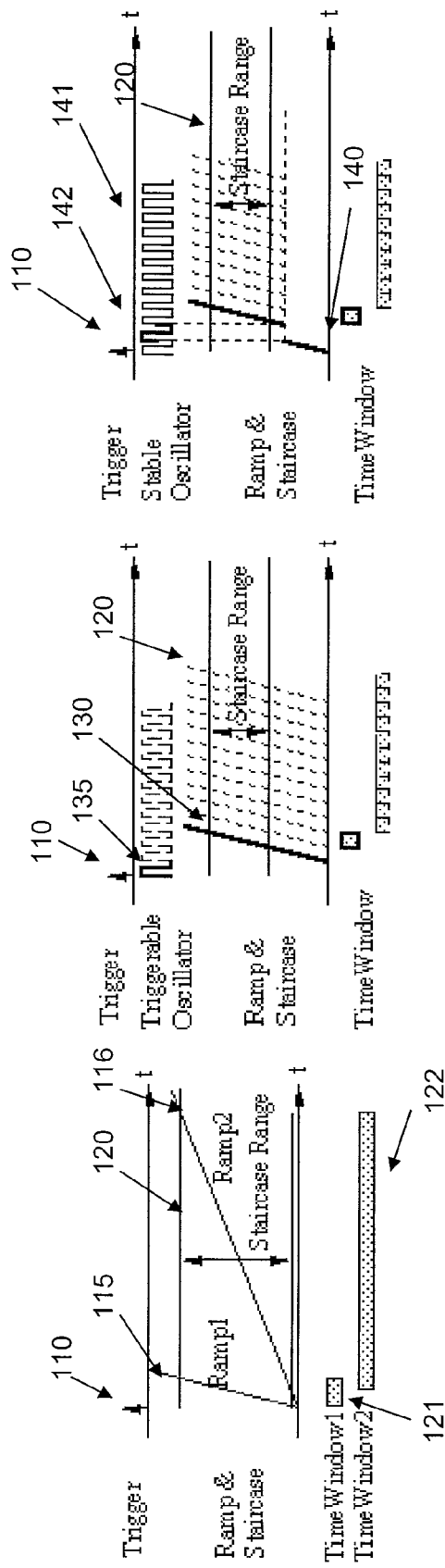
Fig. 1a - Ramp only
Prior Art

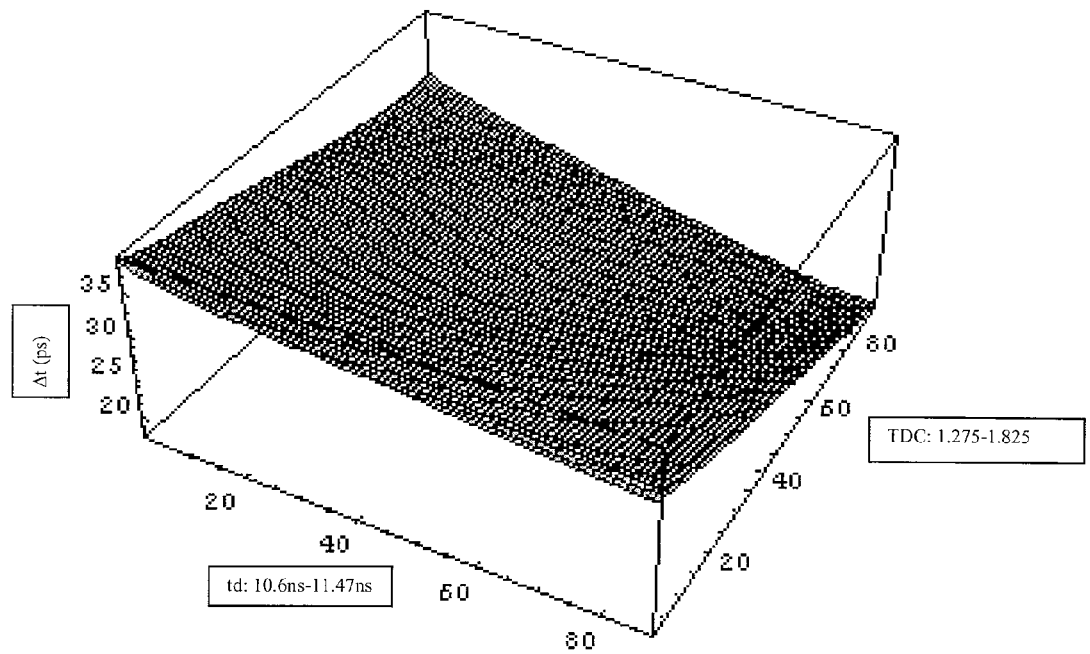
Figure 9i-1 (coarse+offset delay is 10.6ns)
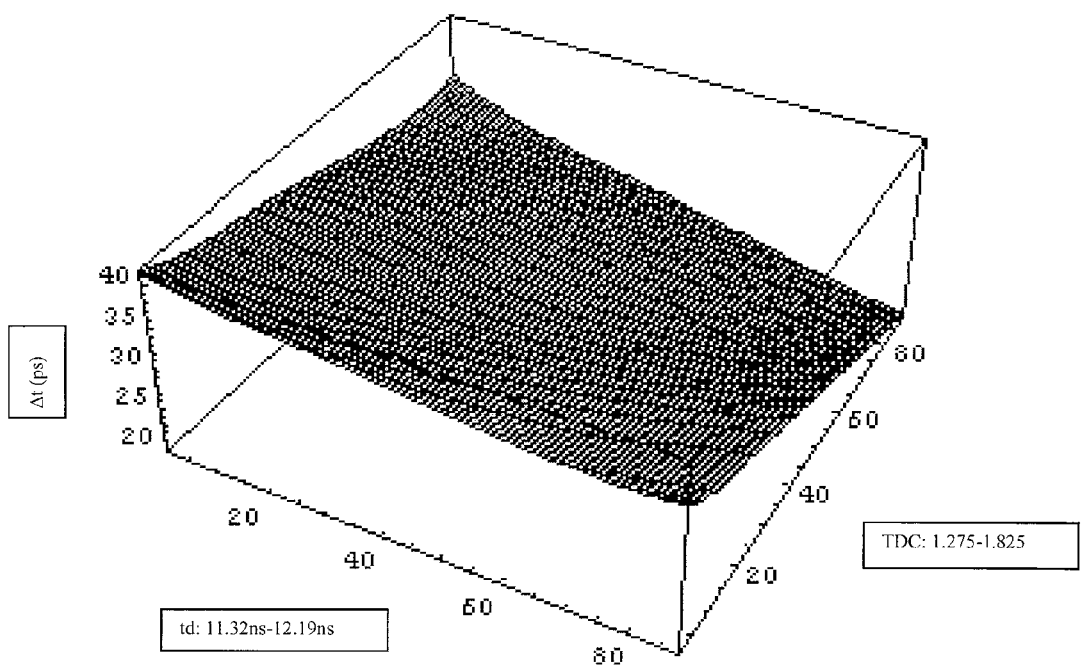
Figure 9i-2 (coarse+offset delay is 11.4ns)

SEQUENTIAL TIMEBASE

CROSS REFERENCE TO RELATED APPLICATIONS

This application claims the benefit of U.S. Provisional Patent Application Ser. No. 60/650,985, entitled "Sampling Scope", filed Feb. 7, 2005, and U.S. Provisional Patent Application Ser. No. 60/656,617, entitled "Sequential Timebase", filed Feb. 25, 2005.

FIELD OF THE INVENTION

The present invention is particularly concerned with a digital storage oscilloscope (DSO) employing a sequential sampling scheme, an equivalent time sampling method that allows a user to measure repetitive input signals with fine time resolution and a targeted delay range. A digital oscilloscope based on this invention can acquire waveforms with high time resolution while greatly reducing deterministic jitter.

BACKGROUND OF THE INVENTION

A sequential time base acts as a kind of pulse generator, the input to which is an external repetitive (but sometimes aperiodic) trigger signal, and the output of which is a sampling pulse that is delayed from the trigger signal by a known, programmable amount of time.

A sequential sampling time-base is a variable delay generator that receives trigger signals and generates sampling pulses. These sampling pulses are positioned at predetermined delays from a stable trigger, thereby allowing the sampling point to progress a small amount each sampling interval, and therefore over time, sample enough points on a repetitive signal to reproduce the signal. The timing delay that is to be employed must allow for a particular precise delay to be generated so that the sampling point moves uniformly through the repetitive signal.

As will be described below, methods for generating this delay have used both analog and digital techniques for obtaining high time accuracy, typically a combination of a ramp generator and a startable oscillator. However the latter is burdened with a choice between overall stability and a quick response. As a result, the jitter specification employing such a system degrades rapidly as the delay time increases.

Prior attempts at providing such a predictable delay for a sequential timebase have met with less than complete success and generally fall into three categories. As is shown in FIG. 1a, a first method employs only an analog ramp function. Thus, upon receipt of a trigger 110, an analog ramp 115 is started. When the voltage in the system reaches a predetermined level 120, resulting in a predetermined time interval, a sample is taken. By adjusting the predetermined voltage level 120, the time interval 121 generated by the ramp can be changed. Alternatively, as is also shown in FIG. 1a, the slope of the ramp may be altered (see analog ramp 116) by changing some of the components in the system, thereby altering the time interval generated by the ramp. This scheme runs into many problems as the length of time to be generated increases. To increase the time interval, the slope of the ramp is flattened. However, this flattening of the slope of the ramp introduces more substantial jitter when the ramp reaches the predetermined voltage level.

Referring next to FIG. 1b, in an attempt to generate less jitter characteristic in a sequential sampling system or a delay generator, it has been suggested to combine fine and coarse delay systems. Thus, as shown in FIG. 1b, a startable oscillator 135 is started upon receipt of trigger 110. The desired time length is counted out by clock oscillations. Additionally, after a predetermined number of clock oscillations have passed, a ramp 130 is started. This ramp allows the coarse timing based upon the counting of clock oscillations to be broken into finer divisions. Thus, by selecting a predetermined voltage level, 120, a corresponding predetermined time interval, preferably smaller than a coarse clock interval time but any appropriate precise timing interval may be employed, may be defined so that a total desired time interval is generated by counting a predetermined number of clock cycles and adding a fine timing interval on the end. This allows longer delays to be generated with less jitter introduced than that introduced due to the flattening of the ramp, as described with reference to FIG. 1a above.

The output of the startable oscillator is used as a coarse time delay for a strobe generator. The strobe generator has a digital counter that is loaded with a coarse delay value from a controller. The output of the startable oscillator is applied to the counter which increments or decrements the counter. The counter increments to a terminal count or decrements to zero whereupon a strobe pulse is generated. This strobe pulse is applied to an analog time interpolator circuit that generates the fine time interval. The controller provides a digital threshold value to a digital-to-analog converter which converts the digital value to an analog threshold value which is applied to the interpolator circuit. The strobe signal from the counter initiates the generation of a ramp signal in the interpolator circuit. The interpolator circuit generates an output strobe pulse to a sampler circuit when the ramp signal equals the analog threshold value.

However, there are a number of problems with this type of system. Indeed, U.S. Pat. No. 5,959,479 issued to Woodward, titled "Sampling Timebase System" (1999) describes that in such a sequential timebase system, the frequency stability of the startable oscillator is compromised since the startable oscillator is designed to have a quick startup time. As a result, jitter becomes larger as the time delay increases.

Another approach is to use an internal high-Q oscillator as a coarse delay clock for counting clock cycles. While this produces a stable oscillation, in order to consider non-integer time intervals, an analog ramp is used, a first portion of the ramp time being used to track timing from trigger to a predetermined oscillation of the stable clock and a second portion of the ramp being used to track timing from the end of a predetermined number of clock oscillations to a predetermined voltage threshold indicative of the desired timing interval. This configuration is described, for example, in U.S. Pat. No. 4,260,912 issued to M. D. Bjorke, titled "Digital Delay Generator" (1981) in addition to a number of other patents. Such a scheme is depicted in FIG. 1c, wherein upon receipt of a trigger 110, an analog ramp 140 is started, and continues to rise until a predetermined clock pulse 142 of a stable oscillator 141 is reached. At this time, the voltage rise in the analog ramp is stopped, and the system counts a predetermined number of clock pulses from the stable oscillator. Once this predetermined number of clock pulses has been reached (1 clock pulse in FIG. 1c) the analog ramp is started again, and rises until the analog threshold 120 is reached, thus denoting the end of the timing interval. While the timing interval is nominally the same as that shown in FIG. 1b (i.e. the timing for the number of selected clock pulses plus the timing for the analog ramp to reach the predetermined voltage level) because in FIG. 1c the oscillator can be a crystal (or crystal referenced), it therefore does not have the startup and stability problems associated with the prior arrangement described in FIG. 1b. However, while U.S. Pat. No. 4,260,912 professes a virtually jitter free timing interval, there is in fact substantial jitter produced in this arrangement because of non-linearities associated with each portion of the ramp, and there are settling time issues when the ramp is stopped and the ramp voltage is intended to be held constant. This is typically not the case.

U.S. Pat. No. 5,402,019 issued to Drummond, and titled "Phase Startable Clock Device" describes a phase startable clock device having a crystal referenced clock.

The phase startable clock device generates a sinusoidal signal, the phase of which corresponds to a time difference between a trigger input and an internal clock generated time. While the name "a phase startable clock device" is similar to a conventional startable oscillator, its principal operation is almost the same as the system depicted in FIG. 1c. However, the almost instantaneous synchronization of the sinusoidal signal phase to the external triggering event is not perfect due to nonlinear effects in the analog processing circuits in the phase startable clock device. The non-ideal circuit operation translates into systematic trigger and gated clock or strobe timing delay errors. These delay errors manifest themselves as deterministic jitter at the output of the timing circuit.

U.S. Pat. No. 6,411,244 issued to Dobos et al., titled "Phase Startable Clock Device For A Digitizing Instrument Having Deterministic Phase Error Correction" (2002), U.S. Pat. No. 6,384,657 issued to Dobos et al., titled "Phase Startable Clock Device Having Improved Stability" (2002), and U.S. Pat. No. 6,522,983 issued to Dobos et al., titled "Timebase Calibration Method For An Equivalent Time Sampling Digitizing Instrument (2003) recognize the shortcomings of the above system of FIG. 1c and propose a countermeasure. For example, the '983 patent utilizes a look-up calibration table based upon only time difference information indicative of the timing between the trigger and the clock to generate a compensation table. While this approach recognizes the jitter problem inherent in the timing circuit, the proposed response is inadequate to sufficiently reduce deterministic jitter.

Therefore, it would be beneficial to provide an improved system and apparatus allowing for a more stable timebase in a sequential timebase system that sufficiently reduced deterministic jitter.

SUMMARY OF THE INVENTION

In accordance with the invention, the inventors have recognized that prior solutions have produced results that are insufficient to provide a stable timing delay. A typical sampling rate of a sequential sampling oscilloscope has been 100 KSps for more than 40 years. However, with the advent of ever faster electronic components, the inventors of the present invention have determined that data acquisition throughput may be raised, employing modern samplers from various manufacturers that may work at rates at 1 MSps or more, and also employing data-conversion devices that work at several tens of MSps with sufficient resolution.

In an oscilloscope, such as a LeCroy® sampling digital oscilloscope employing the present invention and operating at such a data acquisition speed, a periodic strobe output from a pulse generator may be generated, and correlated to a repetitive input signal, having less than 1 picosecond time resolution and less than a few picoseconds jitter for a delay range from about 20 nanoseconds to more than 1 microsecond. The invention employs a three part scheme for generating such a result. These include generating a fine analog delay by using a dual stage ramp providing a high time resolution, counting using a high-Q stabilized internal clock for generating a long delay and less jitter, and greatly reducing deterministic jitter caused by the combination of a finite settling time of a ramp hold signal. Aberrations of the ramp hold signal include hold decay and ramp non-linearity, and are addressed by using time difference information between the trigger and the internal clock, obtained by a TDC (time-to-digital converter) and a predetermined coarse delay count, to generate a calibration table to correct for various timing delays.

It is therefore an object of the invention to provide an improved method and apparatus for generating a stable, low jitter sequential timebase.

The invention accordingly comprises the several steps and the relation of one or more of such steps with respect to each of the others, and the apparatus embodying features of construction, combination(s) of elements and arrangement of parts that are adapted to effect such steps, all as exemplified in the following detailed disclosure, and the scope of the invention will be indicated in the claims.

BRIEF DESCRIPTION OF THE DRAWINGS

For a more complete understanding of the invention, reference is made to the following description and accompanying drawings, in which:

FIGS. 1a, 1b and 1c are graphs depicting operation of prior art instruments;

FIGS. 9b-9i-2 depict data at various stages of generating look up calibration tables in accordance with the invention.

DETAILED DESCRIPTION OF THE PREFERRED EMBODIMENTS

Figure 2:
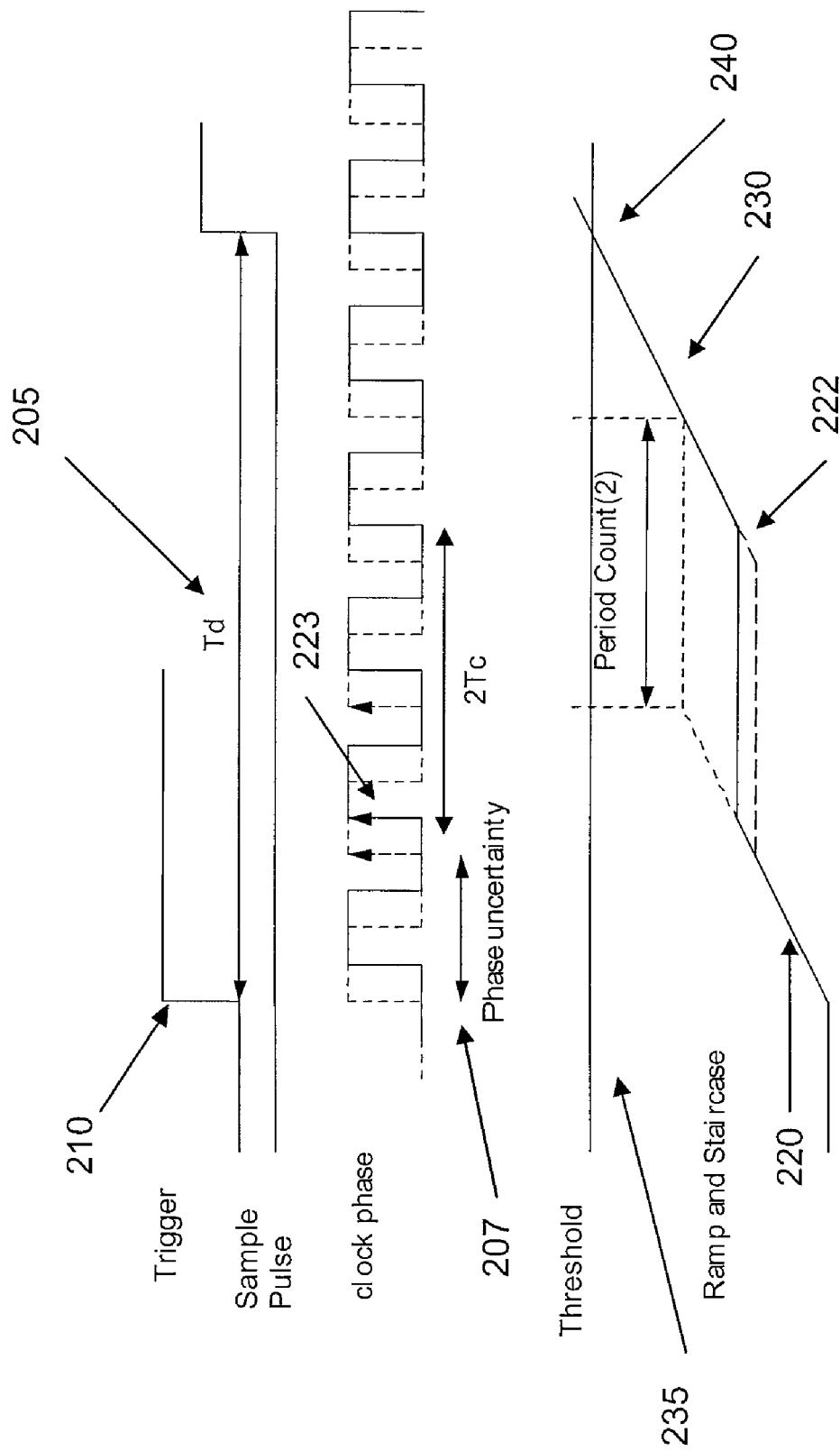
FIG. 2 is a timing diagram depicting the implementation and use of a ramp circuit in accordance with an embodiment of the invention.

One possible architecture for a Delaying Pulse Generator (DPG) employing a dual stage ramp is presented in accordance with the invention in an attempt to provide a more precise elapsed time interval Td 205. As is shown in FIG. 2, when a trigger 210 is input to the DPG of the invention, the first portion 220 of the ramp is started. The ramp is stopped and the voltage 222 thereof is held steady upon reaching a predetermined number of clock pulses 223. In a preferred embodiment, the ramp voltage increase is stopped after two clock pulses are received. Of course, this could be any desired number of clock pulses selected to accommodate the ramp voltage slope, however, two or three clock pulses are preferred to reduce jitter. The important consideration is that the ramp stops synchronous with a clock pulse. The final value 222 of the first ramp 220 corresponds to a time difference between the trigger and designated clock pulse, which may be determined in accordance with a well known time interpolation method such as is used in a random sampling, or other timing method. In addition, this value 222 is proportional to the phase difference or uncertainty 207 between a pulse that would have been started at the trigger as part of a synchronous clock, and the actual asynchronous clock that was continuously running.

After reaching the end of the first portion of the ramp 220, a digital counting scheme is initiated to count a number of clock pulses spanning a time Tc equal to a desired integer number of digital clock pulses. In FIG. 2, this number of clock pulses is shown as 2, but could be any desired number of clock pulses. The value 222 of the ramp circuit is held substantially constant during this counting period. When the number of counted clock pulses equals the desired number of clock pulses, and therefore the time elapsed equals the desired 2*Tc in this example, Tc designating a clock period, the clock pulse counting ends, and the second portion of the analog ramp signal 230 begins. The voltage of ramp portion 230 begins to rise at a predefined rate until it reaches a predefined staircase voltage 235 ($V_{thresh}$). This crossover point 240 then defines the end of the time period Td, and a sample pulse is generated, such as to sample a waveform.

The generated delay Td is expressed by the following equation, provided that the ramps do not have any non-linearity and there is no drift of the voltage value 222 ($V_{comp}$) between the end of the first ramp portion 220 and the beginning of the second ramp portion 230.

$$Td = V_{comp}/SR + n*Tc + (V_{thresh} - V_{comp})/SR = V_{thresh}/SR + n*Tc \quad (1)$$

where SR is the slew rate of both ramps.

As is seen from Equation 1, Td is determined depending on $V_{thresh}$, and n, but not on $V_{comp}$. In turn, the $V_{thresh}$ 235 is selected to define a fine delay, finer than can be achieved by the coarse clock. The lower this value, the earlier the ramp portion 230 reaches $V_{thresh}$, and therefore the earlier after the final clock pulse that the sample pulse will be issued. In a preferred embodiment, the clock pulse operates at 1.25 GHz, thereby defining a time between each clock pulse of 800 picoseconds. The value of $V_{thresh}$ 235 is maintained in a 13 bit DAC, and therefore defines approximately 8000 different values or levels. As the ramp moves up at a constant slope, these 8000 values for $V_{thresh}$ correspond to dividing the 800 picosecond time frame into 8000 divisions, or 100 femtosecond time intervals. Thus, in accordance with a preferred embodiment of the invention, it is possible to progress along a repetitive waveform and sample waveform points separated by 100 femtoseconds. Along with this progression, a TDC value 320 (see FIG. 3) for each sample is produced, and is indicative of the time difference between the trigger and the start of a next (or other predefined) stable clock pulse.

Figure 3:
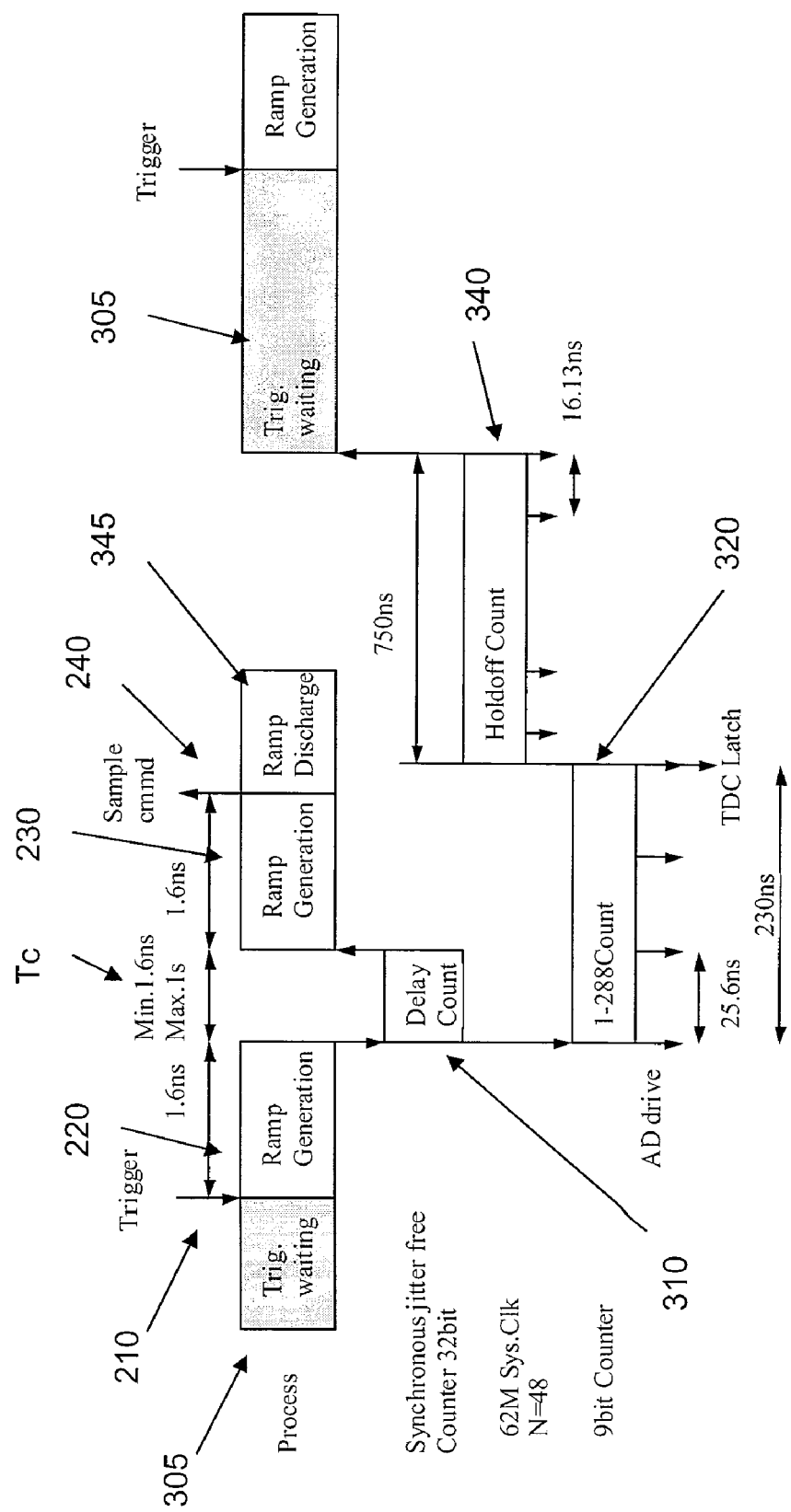
FIG. 3 is a timing chart depicting the relative timing of signals in accordance with the implementation of the ramp circuit of FIG. 2.

A timing chart depicting the sequence of operation for acquiring one sample data, in accordance with a preferred embodiment of the invention is next shown in FIG. 3. In FIG. 3, in conjunction with FIG. 2, after a trigger hold off/waiting period 305 (for allowing the trigger and system to recover from the taking of the prior sample), the trigger signal 210 is input, and ramp voltage 220 begins to rise. The rise time is on the order of from one to two clock cycles (based precisely upon which phase of the clock cycle the trigger is received), and is therefore shown as 2×800 picoseconds, or 1.6 nanoseconds, but will be particularly dependent upon precisely where in a clock cycle the ramp voltage rise begins. Upon reaching the second clock pulse of 223 of the asynchronous clock, the ramp voltage 220 is maintained at a substantially constant level while a predetermined number of clock pulses are counted from the asynchronous clock equal to the time n*Tc. As shown in accordance with the preferred embodiment, this delay may be anywhere from two clock cycles (or 1.6 nanoseconds) to $2^{30}$ clock cycles (or approximately one second) based upon a 30 bit counter 310 for counting clock cycles. Of course, a larger counter could be employed for longer clock counts.

After a predetermined number of clock cycles have been counted by delay counter 310, time n*Tc has been reached, and ramp generation 230 begins and continues until the voltage 230 reaches a predefined threshold value 235. As noted above, the predefined threshold value 235 may be one of approximately 8000 values, corresponding to one of 8000 timing intervals for a single clock pulse. While 8000 points is a maximum number, the number of points actually depends on the actual defined time window. Thus, to sample each of the 8000 points within a clock pulse, during each iteration for collecting a sample, the 13 bit DAC for setting the voltage level 235 is incremented by a predefined amount equal to one of a plurality of predefined levels, or another desired increase level based upon the actual defined time window. When the ramp voltage 230 equals the predefined voltage $V_{thresh}$ the system is at time 240, and the sample pulse is generated. During a following time period 345, the ramp voltage 230 is then discharged back to substantially zero volts (not shown in FIG. 2).

Simultaneously with the counting of asynchronous clock cycles and the second ramp generation voltage rise, until the delay time has elapsed, the value of $V_{comp}$ is digitized within 250 nanoseconds by "TDC" and its result is sent to a processor for time compensation as will be discussed below. A holdoff count 340 is provided for approximately 750 nanoseconds. This holdoff period allows for a maximum sampling rate of 1 MHz. A longer holdoff period can be employed if a lower sampling rate were to be acceptable. Once reset, the system is once again placed in a trigger waiting state 305, awaiting a next trigger.

Figure 5:
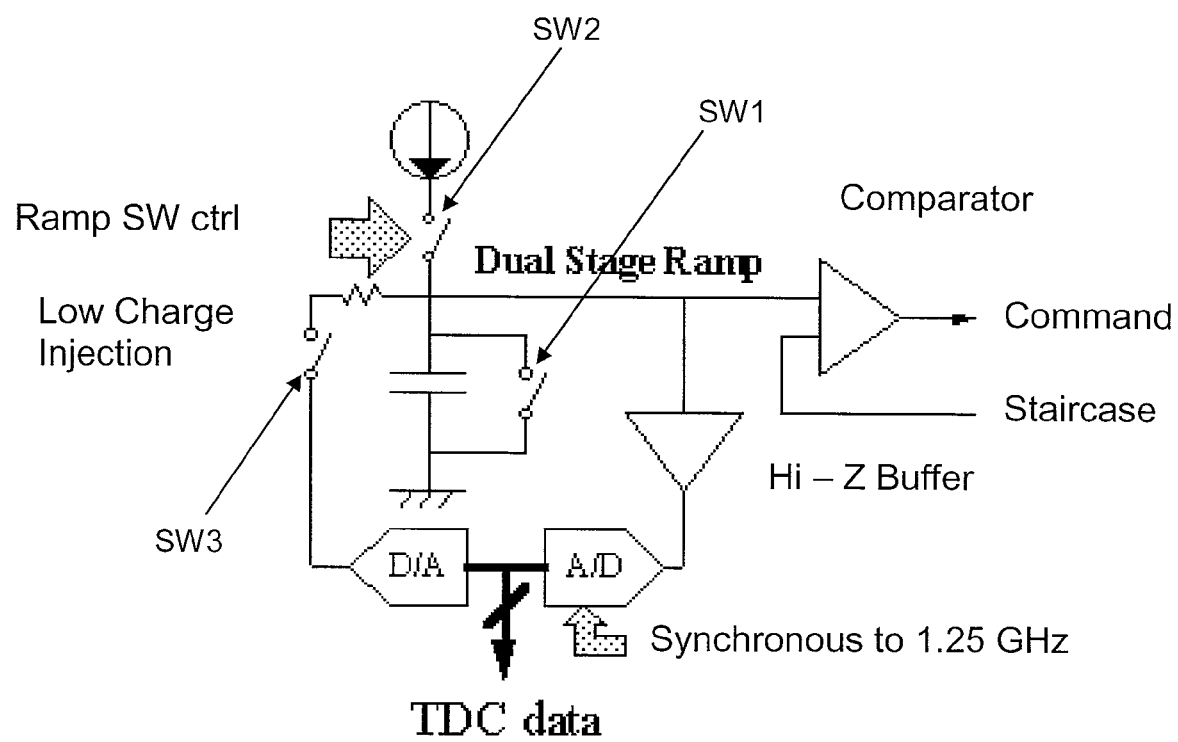
FIG. 5 depicts a hardware configuration of a delaying pulse generator constructed in accordance with a preferred embodiment of the invention.

FIG. 5 depicts a preferred embodiment of a hardware configuration of a delaying pulse generator constructed in accordance with the invention. As is shown in FIG. 5 there are three switches. Before ramp 220 starts, SW1 and SW2 are on, and SW3 is off. A preferred embodiment of SW1 is disclosed in Japanese patent Number 1522689 issued to Kobayashi, titled "Sawtooth generator". SW2 is constructed using a conventional CML switch of a PNP transistor pair with current source, which is also constructed of a PNP transistor. SW3 is constructed using a conventional SBD (Schottky Barrier Diode) bridge for reducing charge injection within 0.5 pC. The generated ramp is output to a pipelined 14 bit ADC (such as AD9244) via a Hi-Z buffer (G<1), which is constructed by a source follower and an emitter follower.

Referring back to FIGS. 2 and 3, as well as FIG. 5, ramp 220 starts by changing SW1 from on to off at the input of trigger 210. Once a predetermined clock pulse from the oscillator is encountered (in a preferred embodiment the second clock pulse 223 after trigger 210), the voltage of the ramp is held substantially constant by changing SW2 from on to off. The hold value Vcomp of the ramp corresponds to a time difference between trigger 210 and clock 223, even though it has an offset value. 9 burst (gated) clocks of 39.0625 MHz (1.25 GHz/32; 25.6 ns) synchronized to the predetermined clock pulse 223, is sent to the A/D converter of FIG. 5 with an appropriate delay (2 ns in this example). The A/D converter outputs a TDC value, which is a digital value corresponding to the voltage level of Vcomp. The TDC data is output approximately 230 ns after the predetermined clock pulse 223 as indicated in FIG. 3. This data is latched and sent to a processor during each sampling operation as TDC data. At the same time, this TDC data is output to a 14 bit D/A converter (such as AD9744 from Analog Device) with a reference input, which enables any gain error caused by the buffer to be adjusted for.

The trailing edge of the 9th burst clock is also sent to the D/A converter and acts as a write clock. The D/A converter outputs an analog level value equal to the previously measured Vcomp. Then SW3 is driven from off to on, and the analog level equal to Vcomp is output to a hold capacitor via a high resistance resistor (in this example, approximately 100KΩ, or more) for holding the stored ramp value equal to the measured Vcomp for a relatively long period of time. Since the feedback of Vcomp is performed through a high resistance resistor, there is no abrupt change in the ramp hold value, so that there is no discontinuity between different delay times.

Two flags are sent to the processor respectively. Flag 1 is generated after the trigger pulse is output. Flag 2 is generated after SW3 is switched to the on position. Receiving both flags, the processor generates a reset pulse for the time base. In this example, if the reset pulse is received more than 750 ns since Flag 2 has arrived, the processor immediately (within approximately 16 ns) releases the holdoff signal. If the reset pulse is received less than 750 ns after Flag 2 arrives, the processor waits the full 750 ns interval and then releases the holdoff signal to ensure that the maximum sampling rate is no more than 1 MHz.

Figure 4:
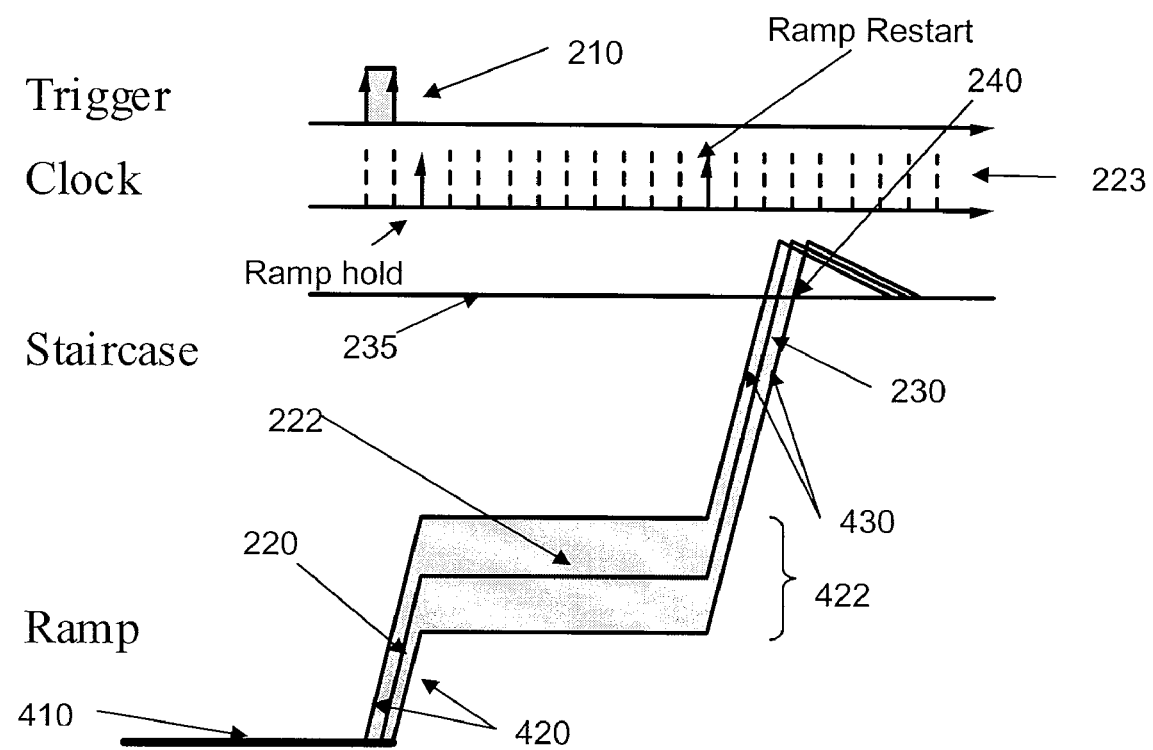
FIG. 4 is a timing diagram depicting variation in various timing features of the invention.

Referring next to FIG. 4, the various timing issues for starting and stopping each of the various ramps will now be discussed. As shown in FIG. 4, the voltage retained by the ramp circuit is first set to substantially zero at 410. Clock 223 is set to a timing reference in FIG. 4, while trigger 210 is set to a timing reference in FIG. 2.

When a trigger 210 is received, ramp generation is started. However because the trigger and the clock are asynchronous in nature, the actual value achieved for the ramp hold voltage may vary, thus giving a range of values 422 that might be measured as the Vcomp value 222. This range of values 422 refers to variation in Vcomp for a given timing relationship between the trigger pulse and the clock edge.

Figure 6:
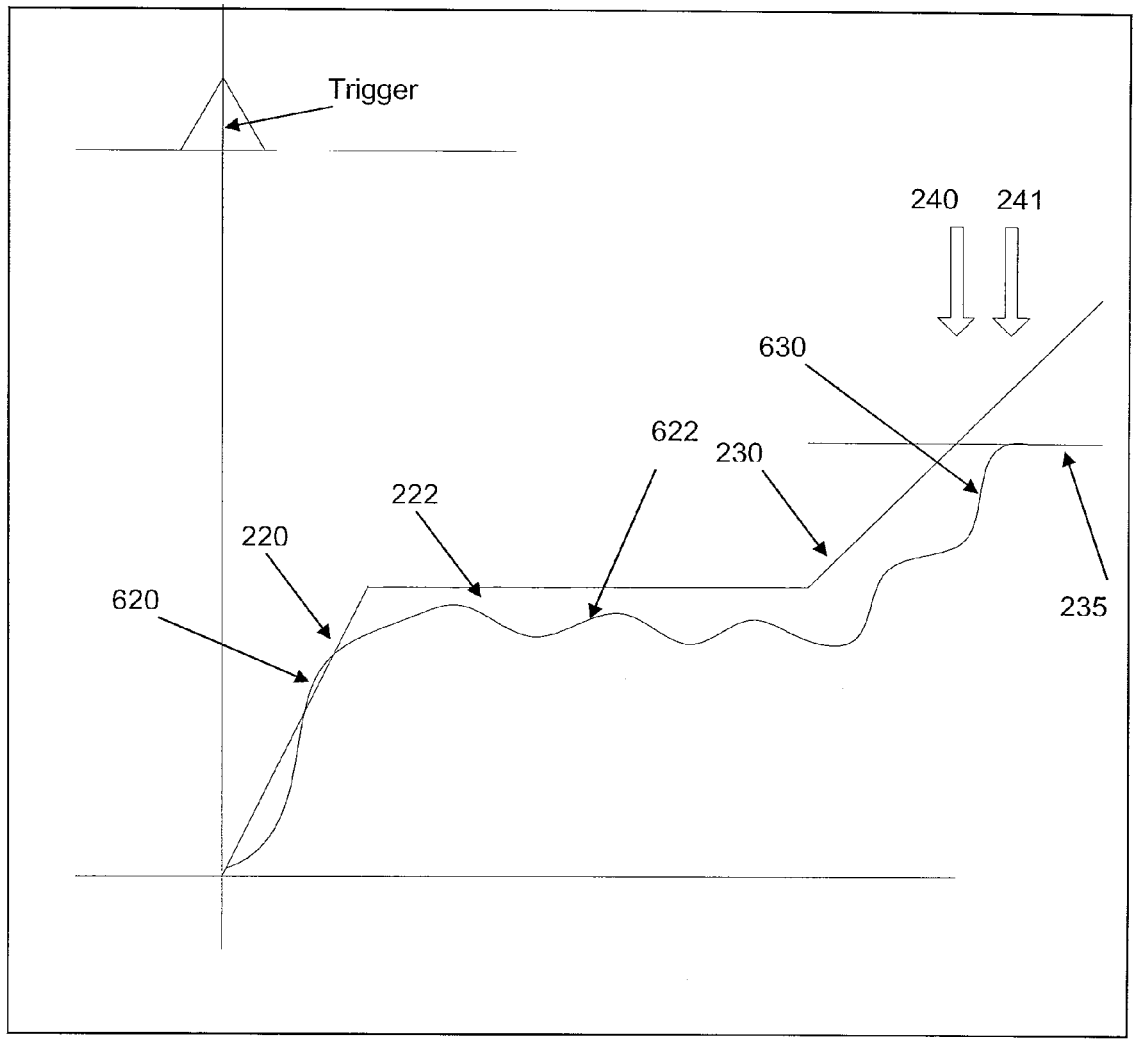
FIG. 6 is a timing diagram depicting variation in the actual recorded signal level in accordance with the invention.

If ramp 220 were linear, the Vcomp value 222 would represent the time difference between trigger 210 and clock pulse 223 precisely. However if a range of possible ramps 420 (corresponding to ideal linear ramp 220) are not linear, the Vcomp value 222 does not precisely represents the time difference between the trigger 210 and the clock 223. Similarly, if ramp 230 is linear and the start level of Vcomp 222 represents the time difference precisely, the delay time between the trigger 210 and the sample pulse generation 240 is generated at the intersection of the ramp voltage 230 and the predetermined threshold 235, is the same regardless of any different value of Vcomp 222 chosen from the range 422. However because the actual ramp corresponding to ideal linear ramp 220 is not perfectly linear, and is instead represented by a range of possible ramps 430 so that Vcomp 222 does not precisely represent the time difference between the trigger 210 and clock pulse 223. Also hold waveform of Vcomp 222 may have a number of different aberrations such as overshoot, ringing or rounding error. Furthermore, the level of hold decay (the amount of decay of the ramp hold voltage level during the clock pulse counting stage) depends on the actual of value 422. Also because an actual ramp chosen from the range of possible ramps 430 (corresponding to ideal ramp 230) is not linear, so that the delay between the start time of ramp 430 and the sample pulse generation 240 does not precisely represent the voltage difference between the predetermined threshold 235 and Vcomp 222. Thus, as is shown in FIG. 6, the straight lines of FIG. 4 representing the two ramp voltages 220, 230 and the hold voltage 222 are not linear or constant, and indeed present a varying signal. This is shown by the varying representations 620, 622, 630. It is the result of this variation in the signal that results in the potential discrepancy between the various possible timing values for the crossover point 430. In FIG. 6, while an ideal crossing of threshold 235 takes place at location 240, in the particular example of FIG. 6, actual crossing of threshold 235 takes place at location 241.

As is clear from the explanation above, in case that the ramps chosen from the possible ramps 420 and 430 have non-linearities (usually different non-linearity), different waveform shapes, and different hold characteristics, the precise timing of the issuance of the sampling command at the end of time Td fluctuates depending on the time difference between the trigger 210 and clock pulse 223. In turn, delay time between trigger 210 and generation of sampling pulse 240 exhibits jitter. This jitter is a function of both the time difference between trigger 210 and clock pulse 223 and the hold period. Therefore, in accordance with the invention, for each combination of time difference and hold period a calibration procedure can be performed as described below so that each time a particular time difference and hold period are employed in the future, a known correction to the timing of the signals can be provided.

This calibration is particularly applicable to the dual ramp generator of the type described in accordance with the invention. Indeed, in the case of a startable oscillator such as that described in FIG. 1b, a ramp non-linearity exists and can be calibrated, however, this nonlinearity, and therefore calibration is not dependent upon a time difference between a trigger and a continuous internal clock. Thus, the jitter phenomena described above does not exist in such a setup. Usually, in such a setup a calibration is performed for compensating the fine delay accuracy of a clock period, but the calibration is not of the type produced in accordance with the invention.

Figure 9A:
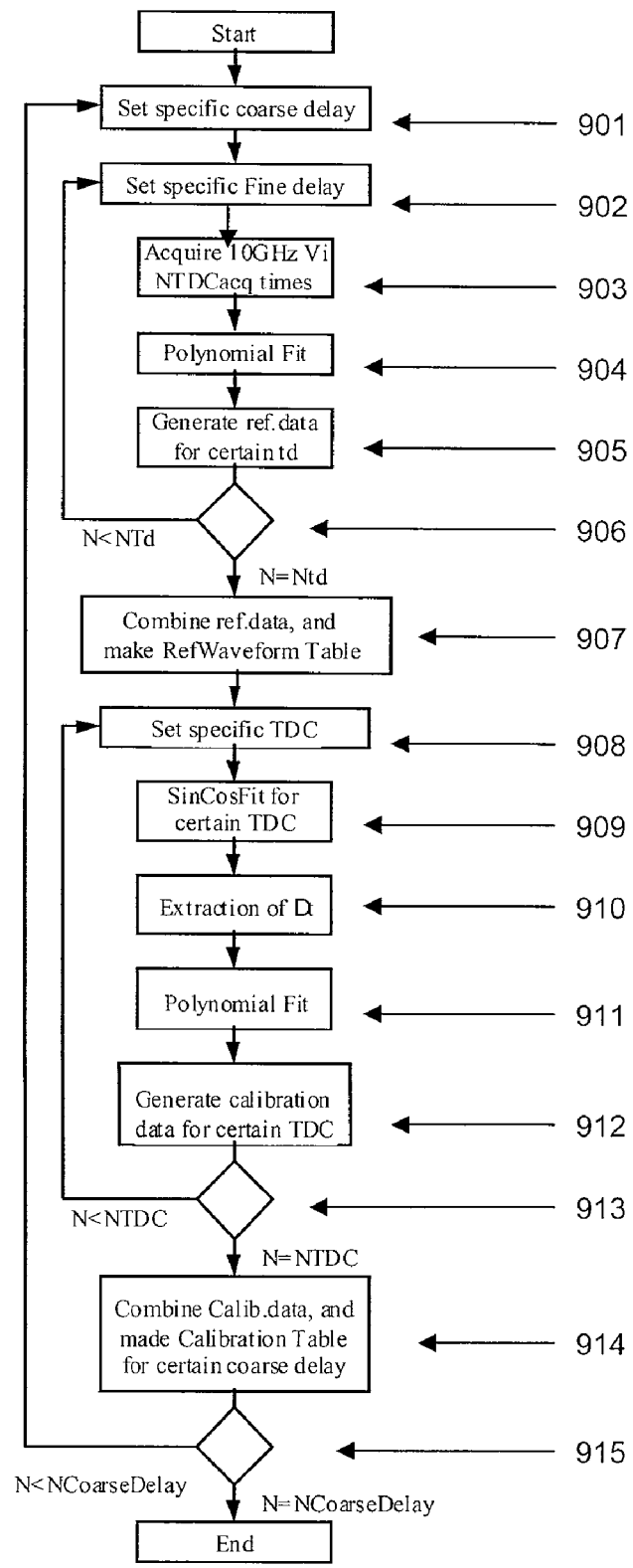
FIG. 9a is a flowchart diagram for generating a look up calibration table in accordance with a preferred embodiment of the invention.

FIG. 9a shows a flow-chart for generating a look up table (calibration table) in accordance with a preferred embodiment of the invention to provide the appropriate time to be added to, or subtracted from, the designated sampling time to correct for inconsistencies in the timing of the sampling pulses due to the various nonlinearities and inconsistencies noted above. FIGS. 9b-9h show output or other relevant data at various steps of FIG. 9a.

As is shown in FIG. 9a, in steps 901 and 902 a particular coarse delay, and then a particular fine delay are selected so that the various calibration tables may be filled for this particular selection. By moving through these nested loops, first, for a particular coarse delay all of the fine delay values will be determined. Then, for a next coarse delay all of the fine delay values will be determined. This continues until calibration tables for all desired coarse delay counts are provided.

At step 903, a known signal, such as a 10 GHz sinusoid (in a preferred embodiment) is input into both a sampler input and a trigger input of an oscilloscope. After an appropriate period of time has passed, corresponding to the designated coarse and fine delay values set in steps 901 and 902, therefore corresponding to a nominal fine delay of "td", and a coarse delay count of "n", the oscilloscope samples the input 10 GHz waveform at a number of trigger times and acquires instantaneous level "Vin" of the sinusoidal input. At the same time, the sequential time-base acquires the TDC value as described above, which corresponds to time difference between each trigger input time and clock generated time. After acquiring N samples (for example N=200) for each nominal delay (in order to average out random jitter, thereby being left with only deterministic jitter that can be compensated for) the following set of data is obtained. Namely, for a single delay value td1, samples are taken for a first TDC value (1,1) and a first Vin level (1,1). Then, for the same td1, a sample is taken for a second TDC value (1,2) and Vin value (1,2). This process continues for the first td1 until N values for TDC and Vin are sampled, as represented as follows:

{(td1, TDC11, Vin11), (td1, TDC12, Vin12) - - - (td1, TDC1N, Vin1N)}

Thereafter, a new delay value td2 is set and a corresponding N time samples are taken again. As a result, for the first and second td values, the following data is obtained:

{(td1, TDC11, Vin11), (td1, TDC12, Vin12) - - - (td1, TDC1N, Vin1N)},

{(td2, TDC21, Vin21), (td2, TDC22, Vin22) - - - (td2, TDC2N, Vin2N)}.

This process continues over a range of delays, defined as a nominal fine delay range (tdmax-tdmin). The value of the fine delay is incremented $\Delta td$ during each iteration to cover all desired td values, and to therefore to cover the entire range of fine delay times corresponding to a particular coarse delay time. The incremental value $\Delta td$ is determined as follows:

M=80 (dividing the fine delay range is into 80 fine levels) is considered to be appropriate for making a calibration table in accordance with the preferred embodiment of the invention;

$\Delta td = Tc/M = 10$ ps, where Tc is the clock period (800 ps)

$td\max = Tc + (0.05*M-1)*\Delta td = 832$ ps, $td\min = -0.05*M*\Delta td = -40$ ps As can be recognized from the above, tdmin and tdmax extend beyond the clock period Tc, to allow for any delay time uncertainty, which is caused by random and deterministic jitter in the system. As a result, there are 88(=1.1*M) data points of fine delay.

Changing tdi 87 times during the above noted sampling acquisition for each coarse delay count, a data table including data sampled for each of 88 tdi time points *200 measured values for each of the time points is generated. By sorting data (defining the first priority as td, and the second priority as TDCij), the following raw waveform table is generated as shown. (Note that $TDC_{ik} \neq TDC_{jk}$, even though they are arranged in the same column. However $TDC_{ij} \leq TDC_{i(i+1)}$.)

{(td_1, TDC_{11}, Vin_{11}), (td_1, TDC_{12}, Vin_{12}), ... , (td_1, TDC_{1,200}, Vin_{1,200})}
{(td_2, TDC_{21}, Vin_{21}), (td_2, TDC_{22}, Vin_{22}), ... , (td_2, TDC_{2,200}, Vin_{2,200})}
{ (td_{88}, TDC_{88,1}, Vin_{88,1}), (td_{88}, TDC_{88,2}, Vin_{88,2}), ... ,
  (td_{88}, TDC_{88,200}, Vin_{88,200}) }

Figure 9B:
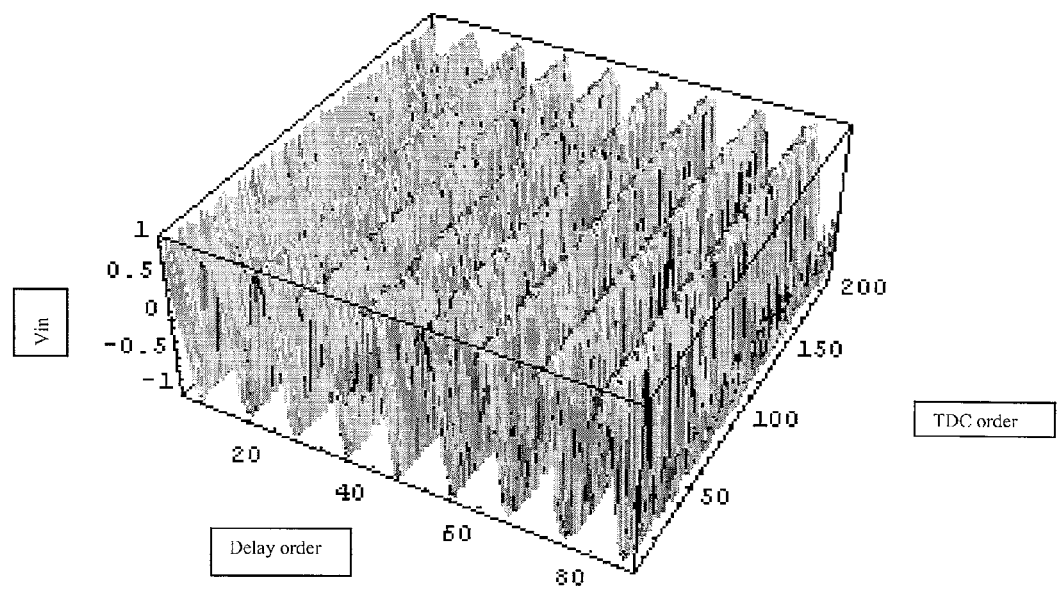

FIG. 9b shows a three dimensional representation of this table as an example, which includes content as follows:

{Vin_{11}, Vin_{12}, ... , Vin_{1,200}}
{Vin_{21}, Vin_{22}, ... , Vin_{2,200}}
{Vin_{88,1}, Vin_{88,2}, ... , Vin_{88,200}}

Along the td-axis (labeled delay order), a sinusoidal waveform {Vin_{k1}, Vin_{k2}, - - -, Vin_{k,200}} is observed. However its shape is rough because corresponding TDCs are different.

Figure 9C:
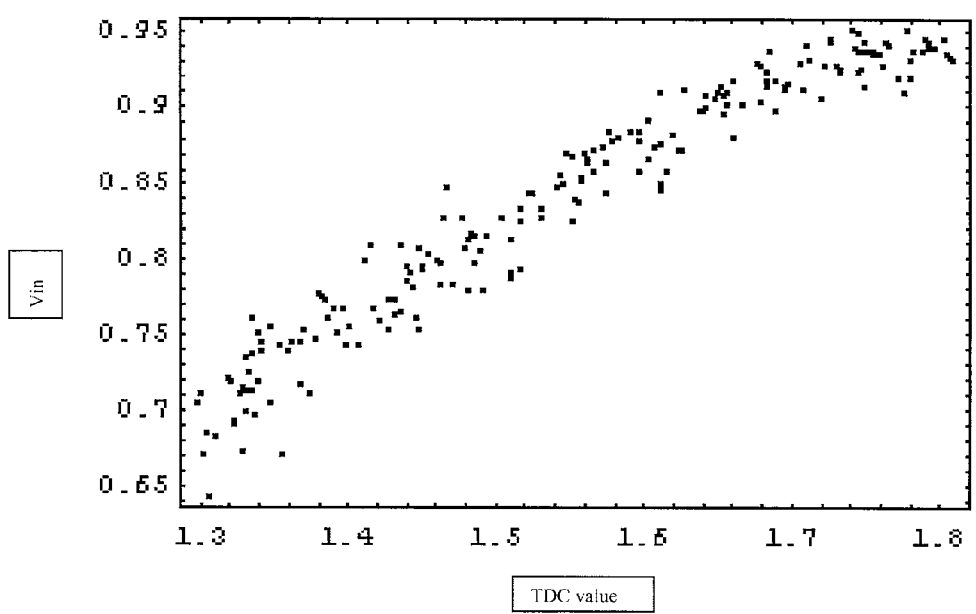

FIG. 9c shows a 2 dimensional representation of {TDC, Vin} for a specific td "tdi", which includes content as follows:

{(TDC_{i1}, Vin_{i1}), (TDC_{i2}, Vin_{i2}), - - -, (TDC_{i,200}, Vin_{i,200})}

Therefore, in step 904 of FIG. 9a, so that matching TDCs are provided in the same columns in the raw waveform table, and therefore their estimated Vins are also correlated, $7^{th}$ order polynomial fittings for each row in the table is performed. As an application of this process, the following polynomial is obtained for the data shown in FIG. 9c. A graph of this polynomial is shown in FIG. 9d.

$y = 6856.53 - 32871.3x + 67056.3x^2 - 75498.1x^3 50696.3x^4 - 20312.6x^5 4498.43x^6 - 424.941x^7$

Figure 9D:
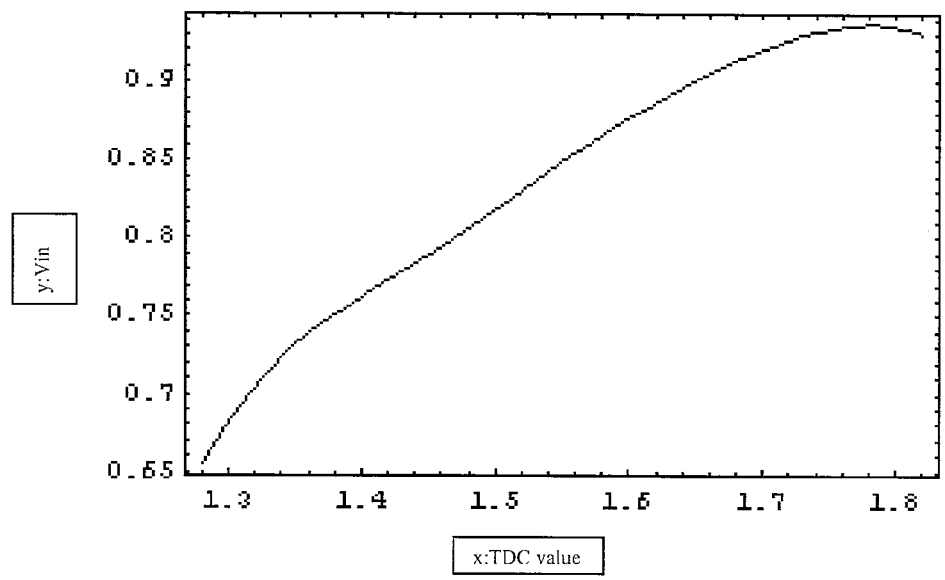

By comparing FIGS. 9c and 9d, it can be seen that such a fitting process eliminates the effect of random jitter of the system, random jitter that was previously present in the raw waveform table.

Using these fitting equations, at step 905, a new Reference Waveform Table is calculated for each calculated Vin'. Its content is as follows;

{(td_1, TDC_1, Vin'_{11}), (td_1, TDC_2, Vin'_{12}), ... , (td_1, TDC_{89}, Vin'_{1,89})}
{(td_2, TDC_1, Vin'_{21}), (td_2, TDC_2, Vin'_{22}), ... , (td_2, TDC_{89}, Vin'_{2,89})}
{ (td_{88}, TDC_1, Vin'_{88,1}), (td_{88}, TDC_2, Vin'_{88,2}), ... ,
  (td_{88}, TDC_{89}, Vin'_{88,89}) }

Each new TDCk is determined as follows, (M=80 is considered to be appropriate for making calibration table, and estimated values for TDCmin and TDCmax are 1.3 and 1.8 respectively).

$TDC_k = (TDC_{max} - TDC_{min})/(M-1)*k + TDC_{min}$, where $-M/20 \leq k \leq M + M/20$ and is 89.

Extended k (from k=−M/20 to 0, and from k=M to M+M/20) are provided to account for the case that actual TDC values might exceed estimated TDCmin or TDCmax by an amount attributable to noise or jitter in the system. At step 906, this process is completed for each value of the find delay.

Figure 9E:
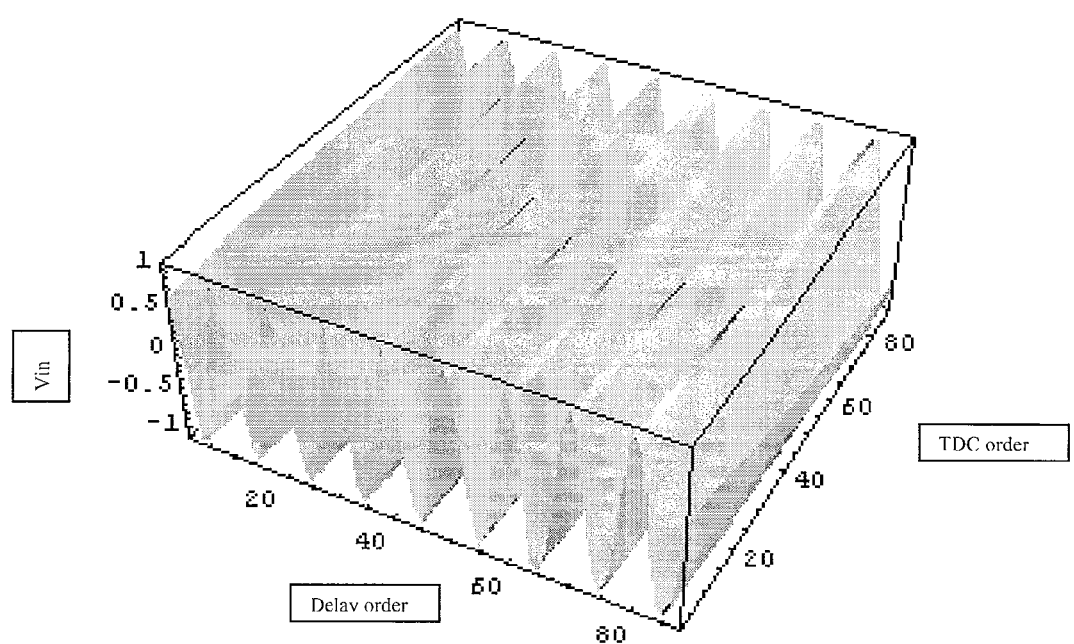

Next, at step 907, FIG. 9e shows a 3 dimensional Figure of the measured Vin' set of values, corresponding to the display in FIG. 9b, but after utilizing the fitting equation noted above. Each component of the table is obtained by inserting $TDC_k$ into each fitting equation.

{Vin'_{11}, Vin'_{12}, ... , Vin'_{1,89}}
{Vin'_{21}, Vin'_{22}, ... , Vin'_{2,89}}
{Vin'_{88,1}, Vin'_{88,2}, ... , Vin'_{88,89}}

In FIG. 9e, all of the data in the "Reference Waveform Table" has a same TDCk for each column. At step 908 a new trigonometric fitting can be performed for each column.

Figure 9F:
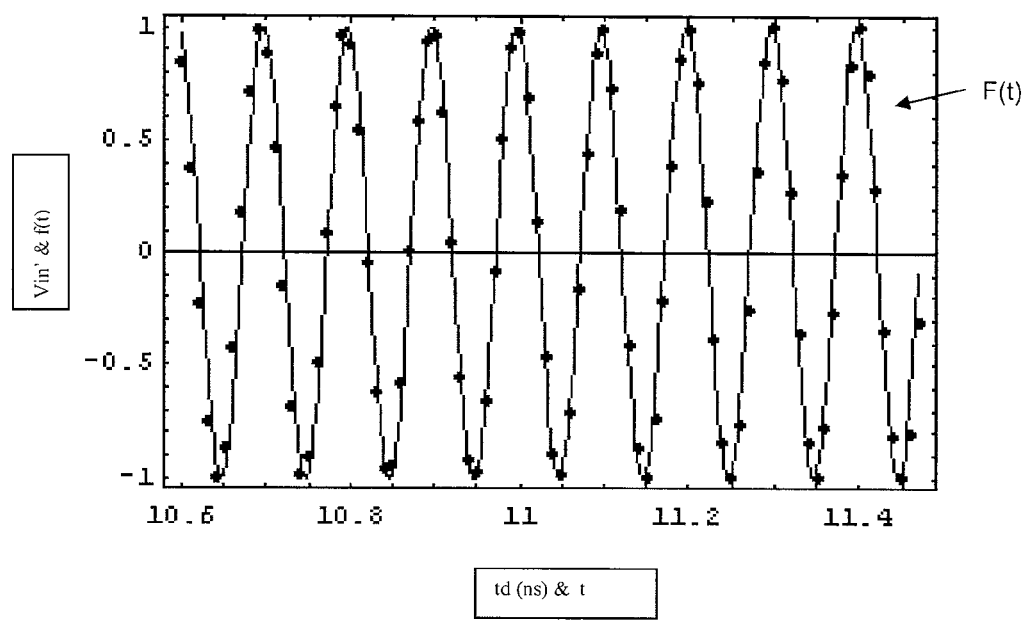

First at step 909, FIG. 9f shows the trigonometric fitting result for a middle column (TDC$_{45}$) of the Reference Waveform Table noted above. 88 black dots are {(td$_1$, Vin'$_{1,45}$), (td$_2$, Vin'$_{2,45}$), - - - (td$_{88}$, Vin'$_{88,45}$)}, which show delay times and instantaneous levels of 10 GHz. The solid line shows a fitting curve f(t) for the dots.

$$f(t)=1.00007*\sin[20\pi(0.0285048+t)] \quad (2)$$

Figure 9G:
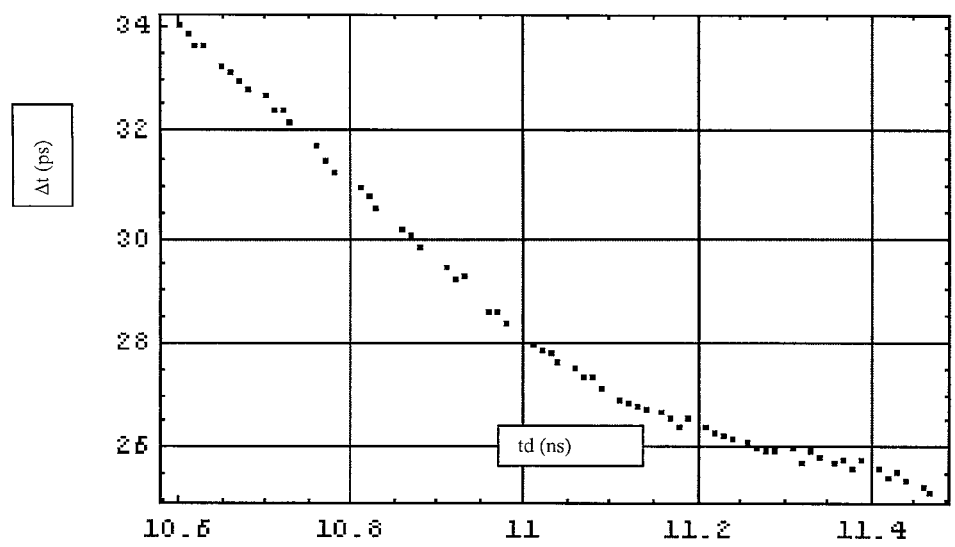

Next, time differences between 88 dots and the fitting curve in FIG. 9f are calculated at step 910, based on the following relation, for example (the actual relationship equation varies depending on phase relation).

$$\Delta t+to=\text{ArcSin}[Vin'_{i,45}/\text{Amp}/(2\pi*10 \text{ GHz})]-\text{Mod}[td_i, 1/10 \text{ GHz}] \quad (3)$$

where to=28.5048 ps and Amp=1.00007 in Equation (2), and Mod [m,n] gives the remainder based upon the division of m by n. The relationship between these differences is shown in FIG. 9g.

Figure 9H:
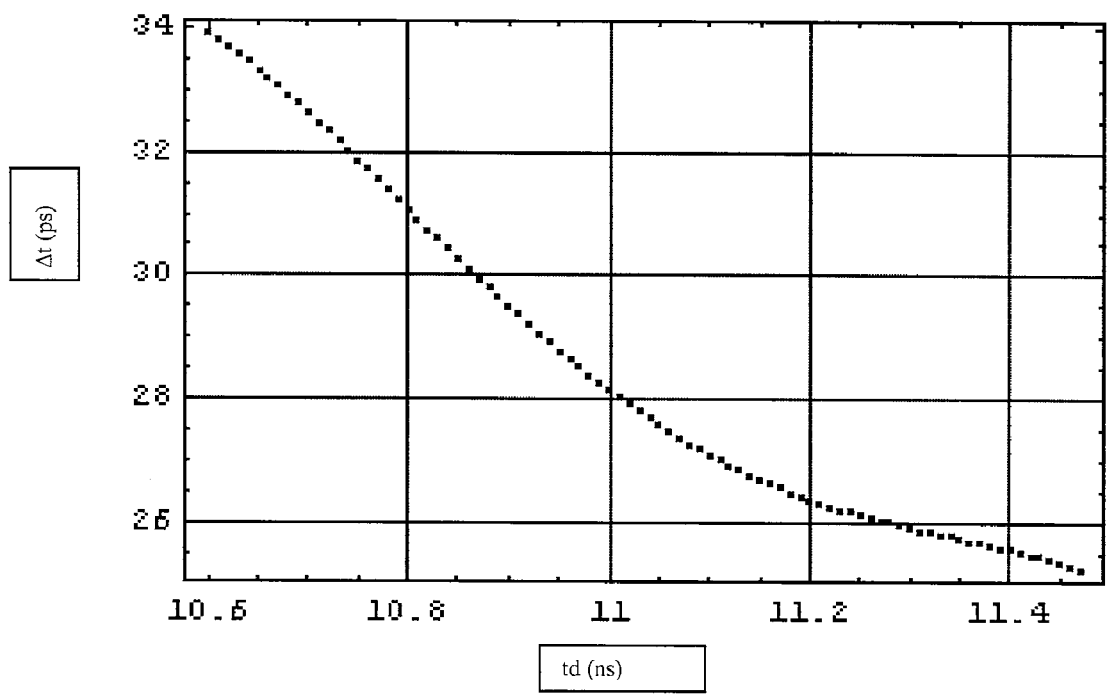

FIG. 9h and Equation (4), below, show a polynomial fitting result for FIG. 9g, as determined in step 911. By utilizing this polynomial fitting, jitter influence is removed from the calibration table, and in step 912 a calibration table for a particular TDC is produced from which an arbitrary delay time td$_i$ for the particular TDC from the calibration table can be chosen.

$$f4(x)=-562371+203561x-27609.9x^2+1663.26x^3-37.5508x^4 \quad \text{Eq.D}$$

Figure 8:
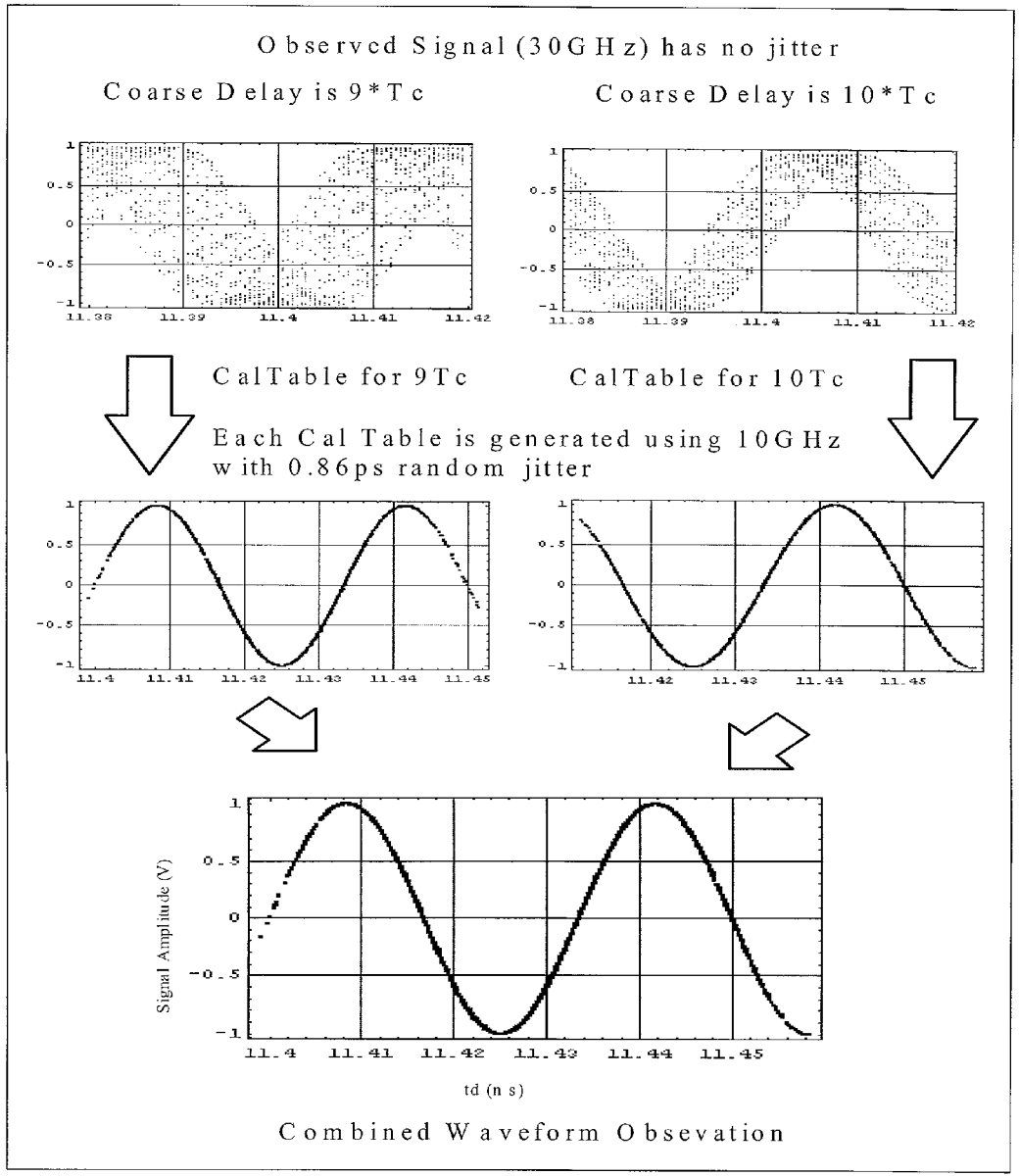
FIG. 8 is a set of graphs depicting the accuracy of a generated timing sequence in accordance with an embodiment of the invention

Next, in step 913, iterating the same procedure for all columns from TDC$_1$ to TDC$_{89}$, a calibration table is obtained for tdi from 10.6 ns to 11.47 ns in step 914, thus accounting for all fine delay values (Coarse delay is 7.2 ns(=Tc*9) and delay offset is 3.4 ns. A fundamental fine delay range is from 10.6 ns to 11.39 ns, and an additional range from 11.40 ns to 11.47 ns is provided to account for any overlap). This table is shown in FIG. 9i-1. The same procedure is repeated for all other coarse delay count values in step 915. FIG. 9i-2 shows another calibration table for one of these other coarse delay count values, namely tdi from 11.32 ns to 12.19 ns (Coarse delay is 8 ns(=Tc*10) and delay offset is 3.4 ns. The fundamental fine delay range is from 11.4 ns to 12.19 ns. Additional range from 11.32 ns to 11.39 ns is provided for overlap). Because of the overlap times provided, there may be different compensated times Δts for the same value of time delay {tdi, TDCj}, in the overlapping range (in this case the overlapped range (from tdi=11.32 ns to tdi=11.47 ns) Thus, depending on the coarse delay value, the correct compensated value is selected Referring to FIGS. 8 and 10, the advantages of the invention will be described. Graphs in the first row of FIG. 8 show raw waveforms of 30 GHz sinusoidal waveform observation at different coarse delay count, 7.2 ns and 8 ns, thus representing different values for Td. Here the clock period Tc is 0.8 ns. The jitter amounts of the two resulting graphs are different. However after repositioning the sampled data using calibration tables of FIG. 9i-1 and FIG. 9i-2 prepared for each coarse delay count in accordance with the method noted above, deterministic jitter is removed, and jitter-eliminated waveforms are obtained as shown in the second row graphs. The third row graph shows two overlaid waveforms, which show no time differences. This shows that not only is jitter reduced, but also that non-linearity correction of the timebase is performed.

By preparing calibration tables for each coarse delay count (i.e. each Td corresponding to the number of clock cycles to be included when Vcomp is maintained at a constant level, deterministic jitter is reduced over the entire timing delay range (from less than 10 ns to 1 m second).

Figure 7:
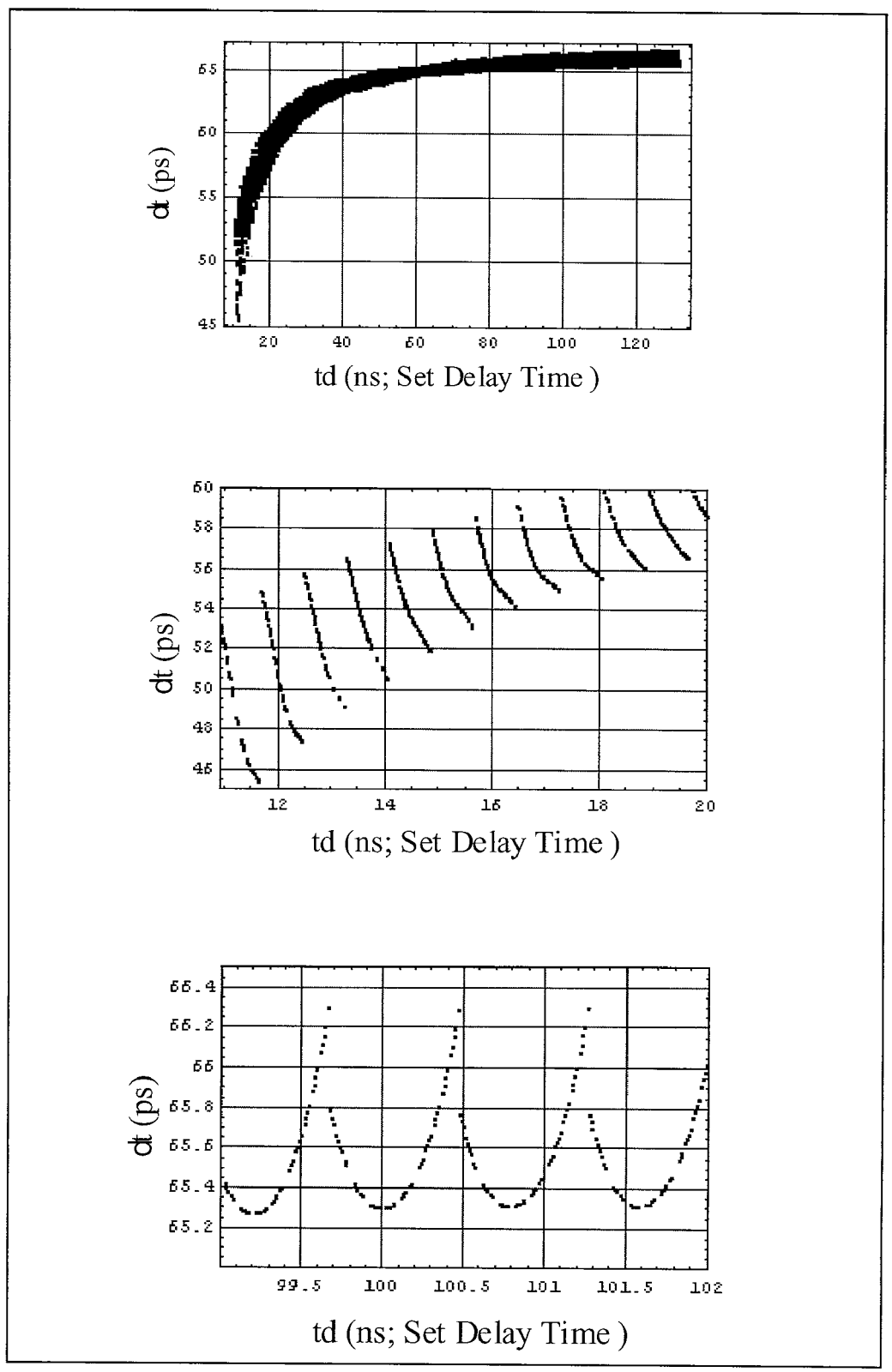
FIG. 7 is a set of graphs depicting various calibration amounts

The first graph in FIG. 7 shows change of calibration amount δt along with delay time from 11 ns to 130 ns when Vcomp is maintained at a specific level. The second and third graphs of FIG. 7 show expansion Figures with delay time around from 11 ns to 20 ns, and from 99 ns and 102 ns.

It can be seen that the δt Figure changes rapidly at every coarse delay of 0.8 ns in a short delay time range, and the δt Figure remains almost the same at every coarse delay of 0.8 ns in long delay time range. The rapidly changing δt Figure change mainly corresponds to aberration (waveform distortion) of the hold signal Vcomp 222 about range 422 (see FIG. 4). The similar δt Figure mainly corresponds to non-linearity both of ramps chosen from the ranges 420 and 430.

In accordance with the invention, a timebase can be calibrated from a short delay range to a long delay range and can reduce deterministic jitter over a very wide range. Therefore, the use of a startable clock device for short delay range to guarantee desirable jitter characteristics (shown in U.S. Pat. No. 6,411,244 as gated OSC 16) is not necessary.

Figure 10:
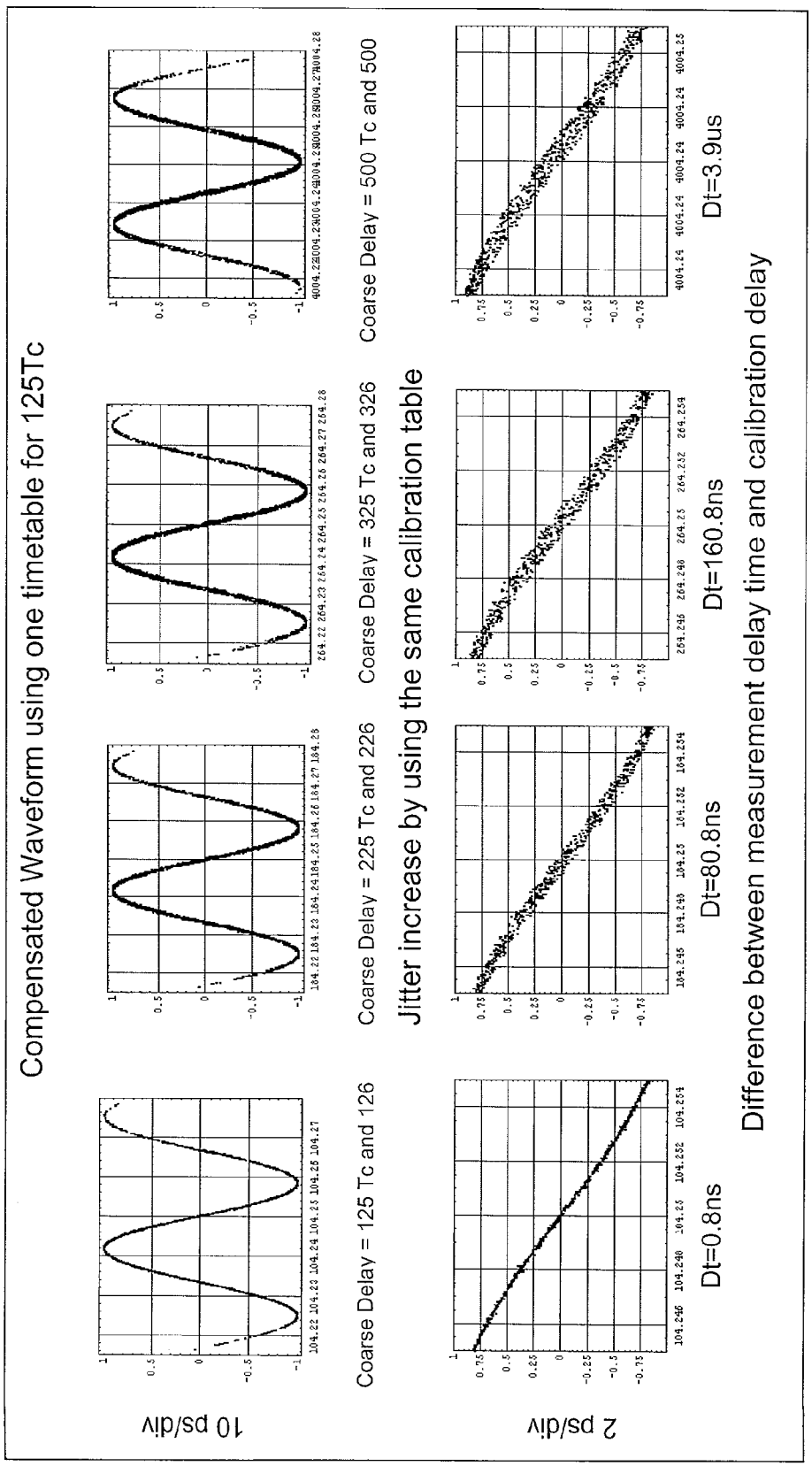
FIG. 10 is a set of graphs depicting the use of a single calibration table on multiple long delay timings.

While this feature of calibration is quite valuable for shorter delay times, it is not necessary to prepare such calibration tables for large delay counts (long Td). Because the switching aberration non-linearity at the time of generating the ramp does not last a long time (usually switching settling time to 0.1% is 100 ns or less), for large delay counts, this variation is not important. The following simulation results agree with this consideration. As is shown in FIG. 10, using a calibration table prepared for a coarse delay count of 125 Tc(=100 ns), and applying it to a timing interval having an actual coarse delay count of 5001 Tc (3.9 μs) (or other shown coarse delay counts), jitter increase is limited to around 1 ps p-p, which is less than a random jitter level such as 7 ps p-p (almost 1 ps rms). Therefore, for longer delay times, determination of a calibration table for each course delay count is not necessary, and the tables can be used for multiple longer time delays.

While this invention has been described as applicable to a dual ramp generator, it is equally applicable to a system employing a phase startable clock device. The additional independent variables used for generating the calibration table improves upon any calibration that may have been performed related to such an apparatus.

It will thus be seen that the objects set forth above, among those made apparent from the preceding description, are efficiently attained and, because certain changes may be made in carrying out the above method and in the construction(s) set forth without departing from the spirit and scope of the invention, it is intended that all matter contained in the above description and shown in the accompanying drawings shall be interpreted as illustrative and not in a limiting sense.

It is also to be understood that the following claims are intended to cover all of the generic and specific features of the invention herein described and all statements of the scope of the invention which, as a matter of language, might be said to fall therebetween.

What is claimed:

1. A method for correcting for errors in a sequential sampling timebase for use with an acquisition system of a test and measurement apparatus, a sample time for the sequential sampling timebase being defined by a time duration of a combination of a fine analog delay and coarse delay determined by the counting of digital pulses of a stable clock, wherein the value of the fine analog delay is held at a substantially constant nominal value during the duration of the counting of the digital clock, comprising the steps of:

measuring a time difference between a trigger at which the fine analog delay starts measuring time and the occurrence of a digital pulse of the stable clock being used to count the coarse delay;

sampling an input waveform at a sample time having a nominal delay time;

providing a desired compensation time for the sample of the input waveform in accordance with a plurality of combinations of three independent variables defining a calibration table, the calibration table having independent variables including the time interval defined by the fine analog delay, the time interval defined by the coarse delay, and the time interval measured between the trigger at which the fine analog delay starts measuring time and the occurrence of the digital pulse of the stable clock being used to count the coarse delay;

reconstructing the waveform by shifting the delay time of sampled value of the input waveform from its nominal delay time in accordance with a value defined by the calibration table; and storing the reconstructed waveform to a computer readable medium.

2. The method of claim 1, wherein the time duration of the combination of the fine analog delay and coarse delay determined by the counting of digital pulses of a stable clock is defined in accordance with a dual ramp generator.

3. The method of claim 1, wherein:

the time duration of the combination of the fine analog delay and coarse delay is defined by a dual stage ramp, the dual stage ramp including a first analog ramp portion, a stable clock, and a second analog ramp portion, the first analog ramp portion tracking timing from a trigger to a predetermined number of oscillations of the stable clock, the stable clock providing a predetermined number of clock pulses (coarse delay), and the second analog ramp portion tracking timing from the end of the predetermined number of clock pulses of the stable clock to a predetermined analog voltage threshold, the voltage threshold being defined to provide a desired fine analog delay portion indicative of the selectable delay time;

the waveform is sampled at a nominal time corresponding to the selectable delay time;

the calibration table is applied, based upon the number of clock pulses and selectable time delay to adjust the nominal time to an actual compensated time; and the sampled waveform is stored corresponding to the actual compensated time.

4. The method of claim 3, further comprising the step of performing the steps of claim 1 for a plurality of selectable time delays, thereby generating a plurality of samples of the waveform corresponding to a plurality of actual compensated times.

5. The method of claim 3, wherein a separate calibration table is provided for each of one or more predetermined number of clock pulses.

6. The method of claim 5, wherein each entry in each separate calibration table corresponds to a value for each of a plurality of predetermined analog voltages and measured number of clock pulses.

7. The method of claim 3, wherein the value of the fine analog delay is held at a substantially constant nominal value during the duration of the counting of the digital clock by a sample and hold circuit.

8. An apparatus for correcting for errors in a sequential sampling timebase, a sample time for the sequential sampling timebase being defined by a time duration of a combination of a fine analog delay and coarse delay determined byte counting of digital pulses of a stable clock, wherein the value of the fine analog delay is held at a substantially constant nominal value during the duration of the counting of the digital clock, comprising:

a time to digital converter for measuring a time difference between a trigger at which the fine analog delay starts measuring time and the occurrence of a digital pulse of the stable clock being used to count the coarse delay;

a sampling circuit for sampling an input waveform at a sample time having a nominal delay time;

a timing compensation circuit for providing a desired compensation time for the sample of the input waveform in accordance with a plurality of combinations of three independent variables defining a calibration table, the calibration table having independent variables including the time interval defined by the fine analog delay, the time interval defined by the coarse delay, and the time interval measured between the trigger at which the fine analog delay starts measuring time and the occurrence of the digital pulse of the stable clock being used to count the coarse delay; and a shifting circuit for reconstructing the waveform by shifting the delay time of sampled value of the input waveform from its nominal delay time in accordance with a value defined by the calibration table.

9. The apparatus of claim 8, wherein the time duration of the combination of the fine analog delay and coarse delay determined by the counting of digital pulses of a stable clock is defined in accordance with a dual ramp generator.

10. The apparatus of claim 8, wherein:

the time duration of the combination of the fine analog delay and coarse delay is defined by a dual stage ramp, the dual stage ramp including a first analog ramp portion, a stable clock, and a second analog ramp portion, the first analog ramp portion tracking timing from a trigger to a predetermined number of oscillations of the stable clock, the stable clock providing a predetermined number of clock pulses (coarse delay), and the second analog ramp portion tracking timing from the end of the predetermined number of clock pulses of the stable clock to a predetermined analog voltage threshold, the voltage threshold being defined to provide a desired fine analog delay portion indicative of the selectable delay time;

the waveform is sampled at a nominal time corresponding to the selectable delay time;

the calibration table is applied, based upon the number of clock pulses and selectable fine time delay to adjust the nominal time to an actual compensated time; and the sampled waveform is stored corresponding to the actual compensated time.

11. The apparatus of claim 10, wherein the apparatus of claim 9 is employed for a plurality of selectable time delays, thereby generating a plurality of samples of the waveform corresponding to a plurality of actual compensated times.

12. The apparatus of claim 10, wherein a separate calibration table is provided for each of one or more predetermined number of clock pulses.

13. The apparatus of claim 12, wherein each entry in each separate calibration table corresponds to a value for each of a plurality of predetermined analog voltages and measured number of clock pulses.

14. The apparatus of claim 10, wherein the value of the fine analog delay is held at a substantially constant nominal value during the duration of the counting of the digital clock by a sample and hold circuit.

* * * * *